(12) United States Patent
Tohei et al.

(10) Patent No.: US 11,877,513 B2
(45) Date of Patent: Jan. 16, 2024

(54) METHOD FOR MANUFACTURING THERMOELECTRIC CONVERSION MODULE

(71) Applicant: Proterial, Ltd., Tokyo (JP)

(72) Inventors: Tomotake Tohei, Tokyo (JP); Takashi Nogawa, Tokyo (JP); Nan Wang, Tokyo (JP); Michiko Matsuda, Tokyo (JP); Takeshi Shimada, Tokyo (JP)

(73) Assignee: Proterial, Ltd., Tokyo (JP)

( * ) Notice: Subject to any disclaimer, the term of this patent is extended or adjusted under 35 U.S.C. 154(b) by 0 days.

(21) Appl. No.: 17/639,320

(22) PCT Filed: Sep. 4, 2020

(86) PCT No.: PCT/JP2020/033570
§ 371 (c)(1),
(2) Date: Feb. 28, 2022

(87) PCT Pub. No.: WO2021/045186
PCT Pub. Date: Mar. 11, 2021

(65) Prior Publication Data
US 2022/0320413 A1    Oct. 6, 2022

(30) Foreign Application Priority Data
Sep. 5, 2019 (JP) ................. 2019-161691

(51) Int. Cl.
*H10N 10/01* (2023.01)
*H10N 10/854* (2023.01)

(52) U.S. Cl.
CPC ........... *H10N 10/01* (2023.02); *H10N 10/854* (2023.02)

(58) Field of Classification Search
CPC .......... H01L 35/22; H01L 35/20; H01L 35/08; H01B 1/22; H01B 1/20; H10N 10/01; H10N 10/854
See application file for complete search history.

(56) References Cited

U.S. PATENT DOCUMENTS

2013/0301184 A1   11/2013   Lee et al.
2014/0150463 A1*   6/2014   Kiyosawa ............... H01L 35/16
                                                             62/3.7

(Continued)

FOREIGN PATENT DOCUMENTS

JP      2009117792      5/2009
JP      2009117792 A *   5/2009   ............ H01L 35/08

(Continued)

OTHER PUBLICATIONS

Inamori, JP-2009117792-A, Machine Translation (Year: 2009).*

(Continued)

*Primary Examiner* — Devina Pillay
(74) *Attorney, Agent, or Firm* — JCIPRNET

(57) ABSTRACT

This method is for manufacturing a thermoelectric conversion module in which a first conductive member, a thermoelectric conversion element, a second conductive member are joined by joining members, the method comprising: a step for, after applying on the first conductive member a first paste including metal particles, disposing the thermoelectric conversion element on the first paste, and compressing and spreading the first paste; a step for disposing the second conductive member, after applying a second paste including metal particles in a controlled amount, on the thermoelectric conversion element, and compressing and spreading the second paste; and a step for sintering the first and the second pastes to obtain joining members.

3 Claims, 11 Drawing Sheets

(56) References Cited

U.S. PATENT DOCUMENTS

2016/0326044 A1 11/2016 Dietz et al.
2018/0310366 A1* 10/2018 Nelson .................... B41M 1/30

FOREIGN PATENT DOCUMENTS

| JP | 2014112587 | | 6/2014 |
| JP | 2017505977 | | 2/2017 |
| JP | 2018125360 | | 8/2018 |
| JP | 2019053856 A | * | 4/2019 |
| WO | 2019082932 | | 5/2019 |

OTHER PUBLICATIONS

Kato, JP-2019053856-A, Machine Translation (Year: 2019).*
"International Search Report (Form PCT/ISA/210) of PCT/JP2020/033570", dated Nov. 24, 2020, with English translation thereof, pp. 1-4.
"Search Report of Europe Counterpart Application", dated Aug. 21, 2023, p. 1-p. 8.

* cited by examiner

RELATIONSHIP BETWEEN PRESSURIZATION AND AREA RATIO OF PASTE SPREAD

METHOD FOR MANUFACTURING THERMOELECTRIC CONVERSION MODULE

CROSS-REFERENCE TO RELATED APPLICATION

This application is a 371 of international application of PCT application serial no. PCT/JP2020/033570, filed on Sep. 4, 2020, which claims the priority benefit of Japan application no. 2019-161691 filed on Sep. 5, 2019. The entirety of each of the above-mentioned patent applications is hereby incorporated by reference herein and made a part of this specification.

TECHNICAL FIELD

The present invention relates to a method for manufacturing a thermoelectric conversion module that directly converts thermal energy into electrical energy by using a heat source of waste heat.

BACKGROUND ART

In recent years, in order to reduce energy consumption, it has been examined to recover waste heat from, for example, a boiler, an incinerator, or a heat source of an automobile as electricity. Patent Literature 1 discloses a structure of a thermoelectric conversion module that recovers heat as electricity. In this structure, electrodes (conductive members) are connected to both sides of a plurality of thermoelectric conversion elements and a process of printing and assembling a joining material containing copper particles as metal particles using a metal mask or the like is performed.

CITATION LIST

Patent Literature

[Patent Literature 1]
International Publication No. 2019/082932

SUMMARY OF INVENTION

Technical Problem

Among the metal particles that can be sintered as in the related art, those containing particles having a particle size of 1000 nm or less so that the sintering temperature is below the melting point of the metal may be called metal nanoparticles. Since characteristic fluid property affected the application of the paste containing metal nanoparticles, it was difficult to apply a controlled amount of the paste onto the thermoelectric conversion element. If the control of the application amount varies, it is difficult to obtain a high output density as the thermoelectric conversion module due to disconnection or short circuit.

An objective of the present invention is to provide a method for manufacturing a thermoelectric conversion module having a high output density.

Solution to Problem

An embodiment of a method for manufacturing a thermoelectric conversion module of the present invention is a method for manufacturing a thermoelectric conversion module in which a first conductive member, a thermoelectric conversion element, and a second conductive member are joined by a joining member, including steps for: applying a first paste containing metal particles onto the first conductive member, disposing the thermoelectric conversion element on the first paste, and compressing and spreading the first paste; applying a second paste containing metal particles onto the thermoelectric conversion element in a controlled amount, disposing the second conductive member, and compressing and spreading the second paste; and sintering the first and second pastes to obtain a joining member.

Further, the first and second pastes may contain a dispersant and a thickener to maintain dispersion in a sedimentation test.

Further, the first and second pastes may have a relationship between a shear rate and a viscosity such that an inclination on the side with a large shear rate is smaller than an inclination on the side with a small shear rate.

Further, a mechanical dispenser may be used to apply the first and second pastes in a controlled amount.

Further, the first and second pastes may be spread over a range excluding at least a part of a corner part of a joint surface of the thermoelectric conversion element.

Advantageous Effects of Invention

According to the present invention, it is possible to provide a method for manufacturing a thermoelectric conversion module having a high output density.

DESCRIPTION OF EMBODIMENTS

Hereinafter, embodiments of the present invention will be described, but in the following description, the first and second are used according to the order of manufacture. In this embodiment, as the assembly process, the assembly process is sequentially performed from a stationary state and the products are loaded in the direction opposite to the direction of gravity. Accordingly, a description will be made such that the bottom of the thermoelectric conversion element is the first and the top thereof is the second. Basically, the same applies to the paste and a description will be made such that the paste for connecting the lower side of the thermoelectric conversion element to the first conductive member is the first and the paste for connecting the upper side of the thermoelectric conversion element to the second conductive member is the second. In addition, this is the same even if there are a plurality of elements and they may be switched. Additionally, all of the metal nanoparticles described in the present invention are metal particles.

Figure 1:
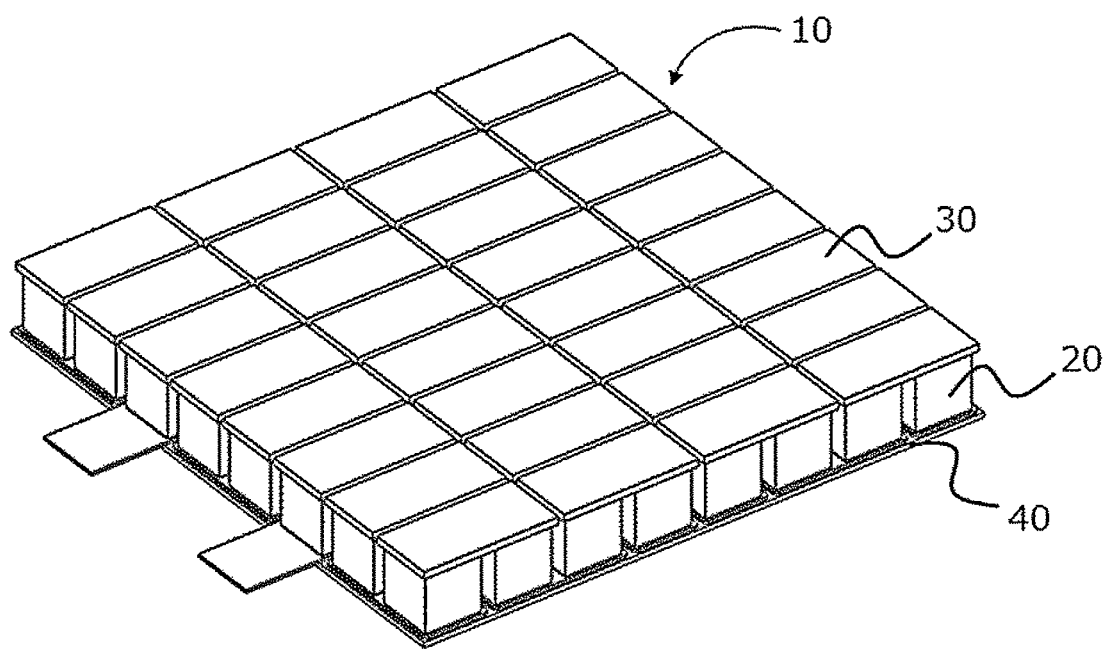
FIG. 1 is a perspective view showing an entire structure of a thermoelectric conversion module.
Figure 2:
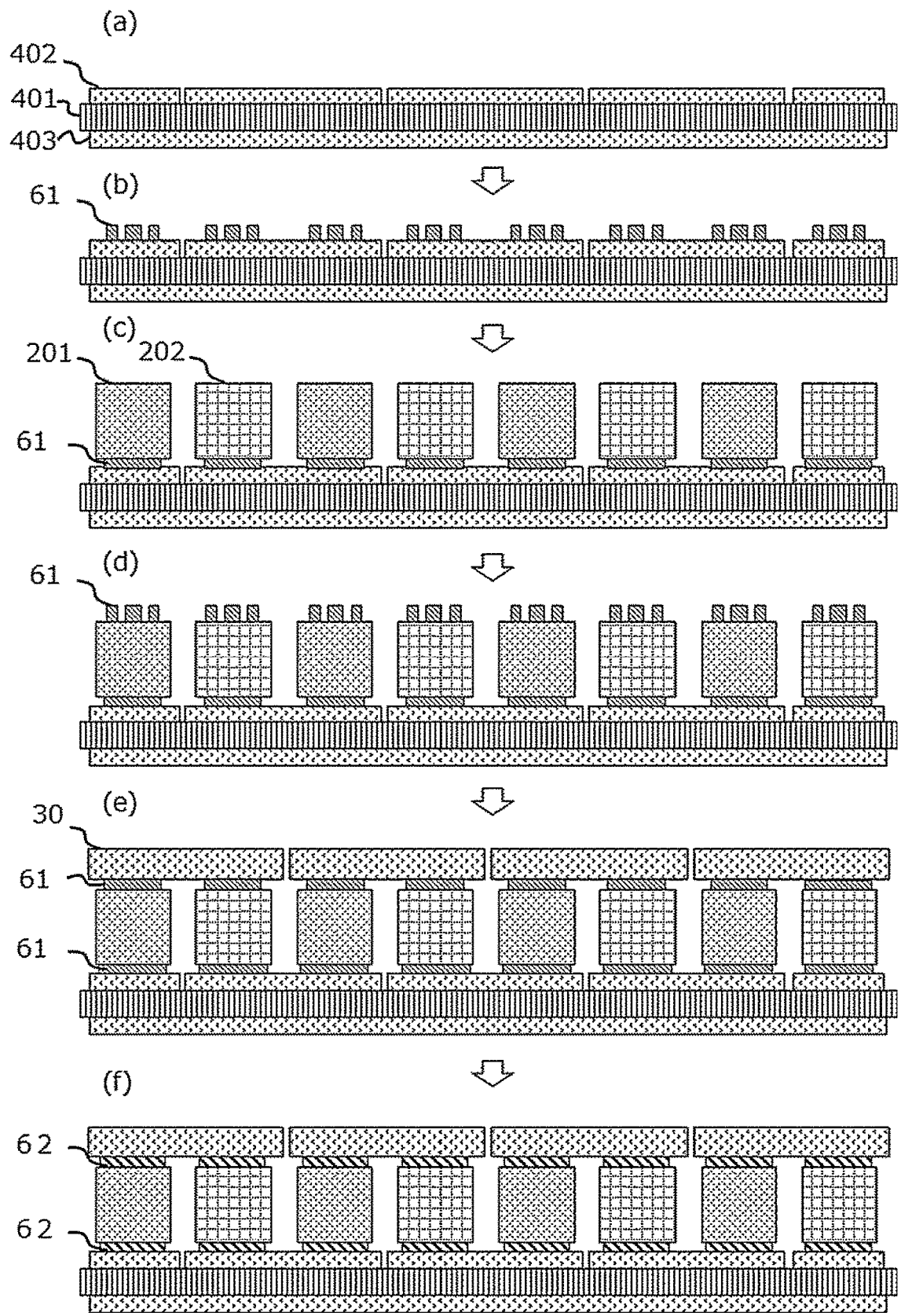
FIG. 2 is a schematic cross-sectional view of a manufacturing process based on a manufacturing flow.

FIG. 1 shows a thermoelectric conversion module 10 which can be obtained by the present invention. In the thermoelectric conversion module 10, thermoelectric conversion elements 20 are arranged between a second conductive member 30 and a first conductive member attachment ceramic substrate 40. Next, FIG. 2 shows a schematic cross-sectional view of a manufacturing process based on a flow as one of the embodiments of the manufacturing method of the present invention. (a) of FIG. 2 is a cross-sectional view of the prepared first conductive member attachment ceramic substrate. In this embodiment, an example of a member installed such that a first conductive member 402 is formed on an upper surface of a ceramic substrate 401 and a metal layer 403 is formed on a lower surface of the ceramic substrate 401 will be described. It is preferable to install the metal layer 403 in this way because the contact thermal resistance when the metal layer is installed in the heat source can be reduced. As the ceramic substrate 401, one having an insulating property can be applied. For example, it is preferable to use a ceramic material such as alumina, aluminum nitride, and silicon nitride because the ceramic material can be used in a wide temperature range from a low temperature to a high temperature. The first conductive member 402 may form a surface that can be joined to metal nanoparticles. For example, the surface may be nickel-plated or the like.

(b) of FIG. 2 is a step for applying a paste 61 (first paste) containing metal nanoparticles to the first conductive member 402. Hereinafter, the expression of arrangement is used in a description of the paste 61 containing metal nanoparticles, but the arrangement includes not only the simple placement but also the operation of compressing and spreading the metal nanoparticle paste 61 into a predetermined shape so as to be in contact with each member.

Metal nanoparticles are metals having a melting point higher than a temperature at which the thermoelectric conversion element and the conductive member are joined, and the paste 61 (first paste) containing metal nanoparticles is applied onto the first conductive member 402. The application of the paste 61 (first paste) containing metal nanoparticles on the first conductive member 402 does not necessarily have to be performed by a mechanical dispenser and the paste may be applied to a desired amount and shape by other printing, a dispenser, or the like.

(c) of FIG. 2 is a step for compressing and spreading the paste 61 (first paste) containing metal nanoparticles through the thermoelectric conversion element while disposing the thermoelectric conversion element on the paste containing metal nanoparticles by a mounter. Here, in the thermoelectric conversion element, a P-type thermoelectric conversion element 201 and an N-type thermoelectric conversion element 202 may be electrically connected in series in order to increase the voltage. FIG. 2 shows an example of in that case. In the following description, when the term "thermoelectric conversion element" is used, it means the P-type thermoelectric conversion element 201 and or the N-type thermoelectric conversion element 202. It is possible to spread the paste 61 containing metal nanoparticles by the load when disposing each thermoelectric conversion element. Accordingly, it is preferable because the joint area between the first conductive member 402 and the thermoelectric conversion element can be secured by the spread metal nanoparticle paste 61 (first paste).

(d) of FIG. 2 is a step for disposing the thermoelectric conversion element and applying the paste 61 (second paste) containing metal nanoparticles onto the thermoelectric conversion element in a controlled amount using a mechanical dispenser. In the case of the application using the mechanical dispenser, the paste 61 (second paste) containing metal nanoparticles can be applied to the thermoelectric conversion element while not contacting the thermoelectric conversion element. Therefore, it is preferable because the misalignment of the thermoelectric conversion element can be prevented. Furthermore, it is possible to apply a paste containing metal nanoparticles to be described later in a controlled amount.

(e) of FIG. 2 is a step for applying the paste 61 (second paste) containing metal nanoparticles onto the thermoelectric conversion element, disposing the second conductive member 30 by the mounter, and compressing and spreading the paste 61 (second paste) containing metal nanoparticles. By the compressing load, the paste 61 (second paste) containing metal nanoparticles can be spread. Therefore, it is preferable because the joint area between the second conductive member 30 and the thermoelectric conversion element can be secured by the spread paste containing metal nanoparticles.

(f) of FIG. 2 is a step for sintering metal nanoparticles to obtain a joining member. The paste 61 (first and second pastes) containing metal nanoparticles disposed between the first conductive member and the thermoelectric conversion element and between the second conductive member and the thermoelectric conversion element is heated so that components other than metal nanoparticles volatilize and sintering of metal nanoparticles progresses. Accordingly, the sintering of metal nanoparticles between the first conductive member and the thermoelectric conversion element and between the second conductive member and the thermoelectric conversion element progresses to form a joining member 62. Accordingly, since heat can be easily conducted to the upper surface and the lower surface of the thermoelectric conversion element, it is possible to manufacture the thermoelectric conversion module having a high output density.

Figure 3:
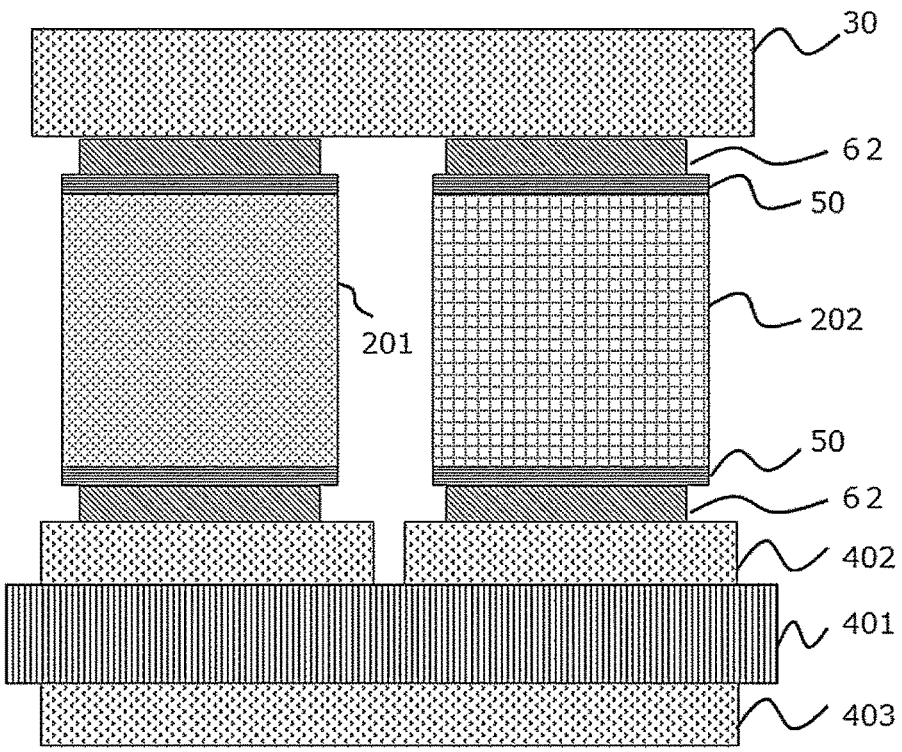
FIG. 3 is an enlarged schematic cross-sectional view of a part of the thermoelectric conversion module.

FIG. 3 is an enlarged schematic cross-sectional view of a part of the thermoelectric conversion module 10 shown in FIG. 1. The first conductive member 402 is joined to the P-type thermoelectric conversion element 201 and the N-type thermoelectric conversion element 202 and the P-type thermoelectric conversion element 201 and the N-type thermoelectric conversion element 202 are joined to the second conductive member 30 by the joining members 62. As the temperature difference between the upper and lower surfaces of the P-type thermoelectric conversion element 201 and the N-type thermoelectric conversion element 202 increases, the output of the thermoelectric conversion module increases. Since the thermoelectric conversion element and the conductive member are simply in contact with each other and are not joined to each other when the joining member 62 does not exist, the heat transfer resistance between the thermoelectric conversion element and the conductive member is large and the temperature difference occurring in the thermoelectric conversion element is small. Thus, the thermoelectric conversion element is joined to the first conductive member 402 and the thermoelectric conversion element is joined to the second conductive member 30 through the joining members 62. Further, a diffusion prevention layer 50 may be provided to prevent element diffusion between the joining member 62 and the thermoelectric conversion elements 201 and 202. In FIG. 3, the diffusion prevention layer 50 is shown as a single layer structure between the thermoelectric conversion element and the joining member. The diffusion prevention layer 50 is made of an elemental metal, an alloy, an intermetallic compound, a nitride, or the like. The diffusion prevention layer 50 may be a plurality of layers made of elemental metals, alloys, intermetallic compounds, nitrides, or the like in order to exhibit a higher diffusion prevention effect. Even when the diffusion prevention layer is composed of a single layer or a plurality of layers, the thermoelectric conversion module can be assembled by the same manufacturing method as that of the embodiment described with reference to FIG. 2. As long as the diffusion prevention layer is conductive and has a function of preventing the diffusion of elements due to heat, the diffusion prevention layer may be, for example, a layer containing nickel, titanium, aluminum, antimony, or the like. These may be prepared, for example, by simultaneous integral sintering of thermoelectric conversion elements.

Metal nanoparticles are metals having a melting point higher than a joining temperature. For example, when the paste 61 containing metal nanoparticles is disposed between the first conductive member and the thermoelectric conversion element and between the second conductive member and the thermoelectric conversion element and is heated at 400° C., it is preferable that the melting point is that of copper (Cu) at 1085° C., nickel (Ni) at 1455° C., silver (Ag) at 961° C., or the like because the fluidity is not generated even during heating and the movement of the element can be suppressed. Not only the elemental metal, but also an alloy containing one or more of the above-described metal elements may be used. The metal nanoparticles are preferably 80 mass % or more as the mass concentration of the particles in the paste with respect to the total mass of the paste.

Furthermore, it is preferable that the metal nanoparticles are composed of spheres in order to promote uniform sintering. Spherical metal nanoparticles having an average particle size of 20 nm or more and 1000 nm or less are preferable, and secondary particles in which these particles are aggregated may be contained. Further, it does not necessarily have to be aggregated secondary particles, and there is no problem even if it contains spherical powder of 1 µm to 50 µm. It is preferable that an organic coating layer is formed on the surface of the metal nanoparticles. Since excessive aggregation is prevented by the action of the organic coating layer and sintering becomes easy to proceed by reducing the oxide film formed on the surface of the metal nanoparticles at the time of joining, it is possible to perform joining by sintering by maintaining a temperature at 300 to 400° C. for 5 to 60 minutes in a hydrogen atmosphere or a reducing atmosphere containing hydrogen, for example.

The application of the paste containing metal nanoparticles includes a step of applying the paste to the first conductive member to contact the thermoelectric conversion element and a step of applying the paste containing metal nanoparticles onto the thermoelectric conversion element by the mechanical dispenser to contact the second conductive member. That is, when the thermoelectric conversion element is heated while the paste containing metal nanoparticles contacts both surfaces thereof, it is a batch joining method that joins the first conductive member, the thermoelectric conversion element, and the second conductive member in one step.

The paste containing metal nanoparticles may contain, for example, metal nanoparticles of the joining member and an organic solvent such as water, a glycol-based solvent, and a glycol ether-based solvent as the main solvent. By including these, it is possible to prevent excessive aggregation of the joining member made of metal nanoparticles and maintain the dispersion of the joining member. If the dispersion of the metal nanoparticles is maintained, stable application becomes possible with the mechanical dispenser to be described later.

Further, it is preferable that the paste containing metal nanoparticles contains a dispersant and a thickener and the dispersion is maintained in the sedimentation test. First, the dispersant adheres to the surface of the metal nanoparticles and acts to prevent the van der Waals force acting between the particles. Examples of the substance acting as a dispersant in an organic solvent include nonionic surfactants such as glycol ethers, esters, ester ethers, phenyl ethers, alkyl glucosides, acid amides, amines, and alkanol amides. In particular, a system containing polyalkylene oxide in the molecular chain is effective because the system contains a hydrophilic group and a hydrophobic group, and diethylene glycol monobutyl ether, diethylene glycol monobutyl ether acetate, dipropylene glycol methyl ether, and the like are preferable.

Next, the thickener refers to a substance that can increase the viscosity of the paste and has a function of slowing down the sedimentation rate of the particles. As the thickener, a highly viscous solution may be added or a binder substance may be added. A substance that acts as a binder is a substance that increases the interaction and increases the viscosity by binding the particle and solution or the particle and particle with an organic molecular chain having a polar group. Polyalkylene oxide, polyvinyl alcohol, and the like are used as typical binders, but it is preferable that the binder can be volatilized in the paste using metal nanoparticles at 300° C. or less which is lower than the sintering temperature. In particular, a polyglycol system having an average molecular weight of 400 or less, which is liquid at room temperature, is preferable. The dispersant and the thickener may be arbitrarily determined in consideration of the viscosity of the paste and the like. For example, the ratio of the thickener to the volume of only the solvent excluding metal nanoparticles is preferably larger than 0 vol % and smaller than 100 vol %, more preferably 5 vol % or more and 95 vol % or less, and particularly preferably 30 vol % or more and 90 vol % or less.

Figure 12:
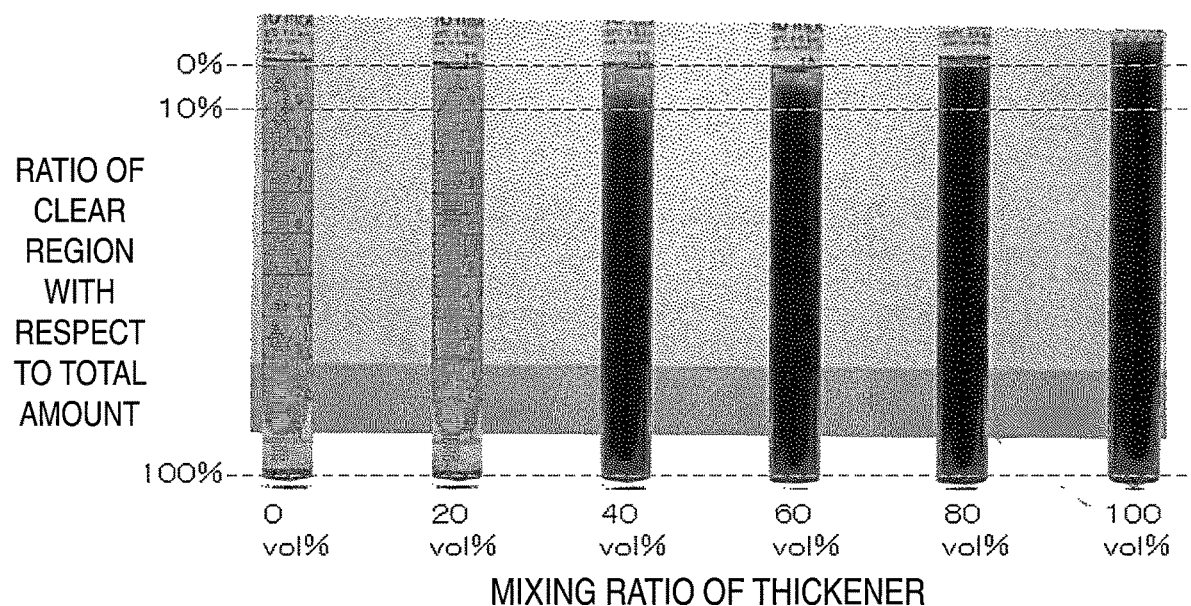
FIG. 12 is a photograph of a sedimentation test.

The sedimentation test will be described below. The sedimentation test performs evaluation by placing a certain amount of suspension of metal nanoparticles in a graduated cylinder, allowing the suspension to stand, and observing the ratio of the clear region and the suspension region of the suspension at regular intervals. Here, the suspension is only a solvent excluding metal nanoparticles. For the clear region, a liquid not containing metal nanoparticles and using an organic solvent such as water, a glycol-based solvent, and a glycol ether-based solvent as the main solvent was prepared in another graduated cylinder, and the region was set to the same degree of transparency. The example is shown in FIG. 12. FIG. 12 is a photograph of a graduated cylinder containing a suspension under the conditions of 0 vol %, 20 vol %, 40 vol %, 60 vol %, 80 vol %, and 100 vol % as the ratio of the thickener from the left when taken from the side after six days. The dashed line shows the reference line (10%) of the ratio of the clear region to the total amount. It can be said that the sample with less clear regions in the suspension of the metal nanoparticles to be evaluated maintains the dispersibility and is less likely to sediment and separate. In the present invention, it was determined that the dispersion would be maintained under the condition that the clear region was 10% or less of the total amount after six days.

When applying the paste containing metal nanoparticles onto the thermoelectric conversion element, the mechanical dispenser controls the application amount by the rotation amount of the screw. The mechanical dispenser is more preferable than an air pulse type dispenser or a printing method because the paste containing metal nanoparticles can be applied in a controlled amount. The number of screw rotations may be appropriately set depending on the application conditions and the like. For example, it is preferable that the number of screw rotations is smaller than 20 rpm because the dispersed state of the metal nanoparticles in the main solvent of the paste to be applied is maintained. On the other hand, 5 rpm or more is preferable in consideration of an appropriate tact time depending on the application time of the paste. From the viewpoint of the dispersed state of metal nanoparticles and the tact time, 5 to 15 rpm is more preferable.

Figure 14:
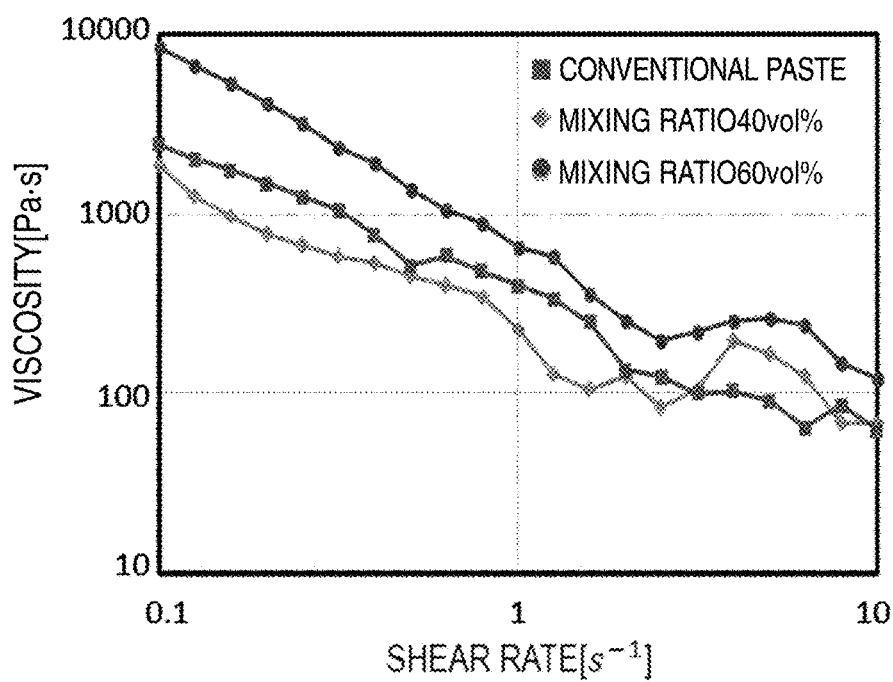
FIG. 14 is a correlation diagram between the shear rate and the viscosity of the paste.

The details of the reason why the mechanical type is particularly preferable in the application by the dispenser will be described below. The paste containing metal nanoparticles also affects the sedimentation rate, dispersibility, and thixotropy of the metal nanoparticles themselves depending on the ratio of the main solvent and the metal nanoparticles. Thixotropy is a characteristic fluid property that shows changes in paste viscosity with respect to the shear rate (deformation rate when a force is applied to the paste) and changes over time and is especially likely to appear when the influence of the interaction between metal nanoparticles is large compared to the interaction between metal nanoparticles and solvent. In order to confirm whether the thixotropy is obtained, for example, the correlation of the viscosity with the shear rate may be confirmed as shown in FIG. 14. FIG. 14 shows three examples of the thixotropy. Since the mixed specific metal nanoparticles have a large specific surface area, the interaction between the particles is stronger than that of ordinary powder and hence the particles tend to aggregate with each other. In the region where the shear rate is high, the interaction between the metal nanoparticles in the main solvent is disrupted and the viscosity drops sharply. This corresponds to the inclination of the side having a high shear rate smaller than the inclination of the side having a small shear rate in the above-described correlation of the viscosity with the shear rate. That is, it is characterized in that the thixotropy is high. In FIG. 14, all three examples of the thixotropy have a region where the viscosity drops sharply. In the case of the mechanical dispenser, since the discharge amount is mechanically controlled by the rotation amount of the servomotor unlike the air pulse type, it is possible to suppress the influence of air pressure variation as in the air pulse type. That is, the aggregation of metal nanoparticles and the change in the dispersed structure before and after passing through the needle due to the pressure fluctuation are less likely to occur than in the air pulse type. The definition of the mechanical dispenser has a structure in which the paste is subjected to a force other than a pressing force such as a rotary shear force. Specifically, for example, a structure that presses out the paste while the piston part rotates can be considered. Even if the interaction between the metal nanoparticles is strongly aggregated by a force other than this pressing force, the aggregate is likely to be preferably destroyed.

In the thermoelectric conversion module, the paste containing metal nanoparticles is applied to above and below the thermoelectric conversion element, but the mechanical dispenser is used when applying the metal nanoparticle paste above at least the thermoelectric conversion element. For example, when applying the metal nanoparticle paste above the thermoelectric conversion element by printing, the screen mask or metal mask comes into contact with the thermoelectric conversion element during printing. Accordingly, since a short circuit occurs due to the misalignment of the thermoelectric conversion element, the power generation performance of the thermoelectric conversion module deteriorates. In comparison, in the case of the mechanical dispenser, the metal nanoparticle paste can be applied to the thermoelectric conversion element in a non-contact manner, and the misalignment of the thermoelectric conversion element can be suppressed. Here, for the convenience of the order of description, it is described above and below, but as described above, it can be read as first and second, one and the other, or the like. That is, in the present invention, it is important to apply the paste containing metal nanoparticles to the thermoelectric conversion element to which the paste containing metal nanoparticles has already been applied in a controlled amount using the mechanical dispenser.

Figure 4:
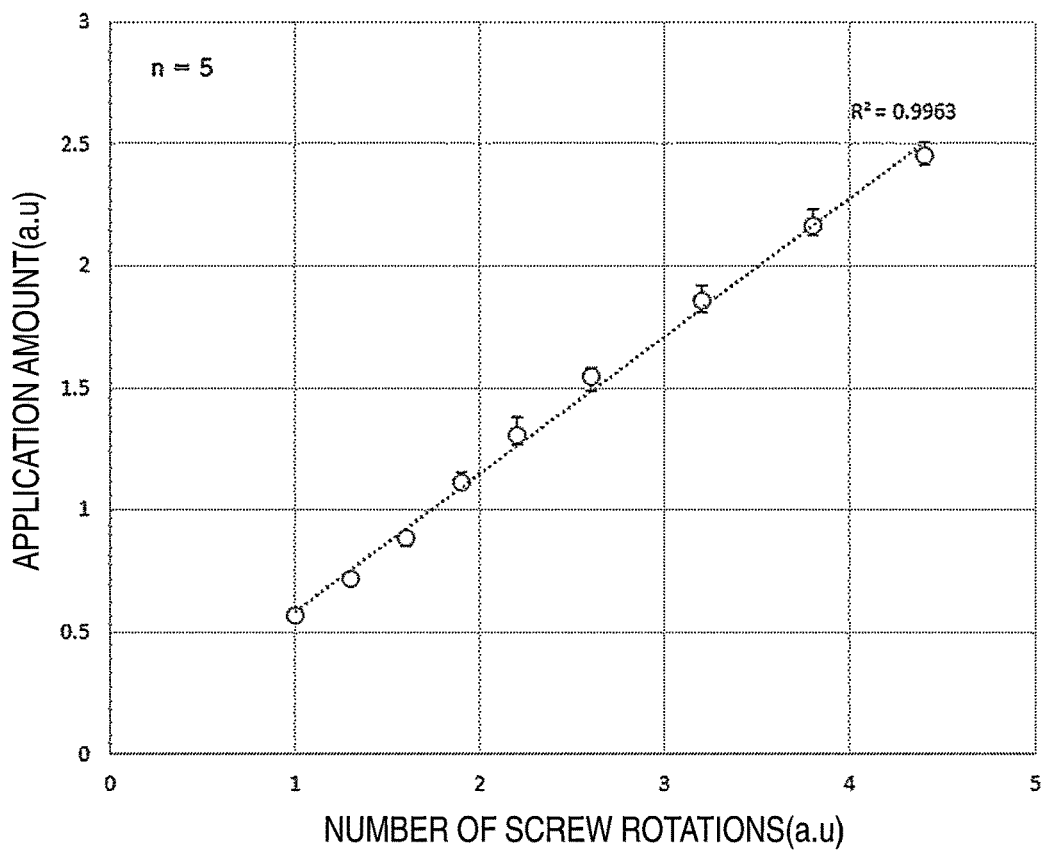
FIG. 4 is a diagram showing a relationship between an application amount of a mechanical dispenser and the number of screw rotations.

FIG. 4 is a diagram showing a relationship between the number of screw rotations and the application amount when the paste containing metal nanoparticles is applied at the number of screw rotations of 10 rpm. It can be seen that the application amount is stably and linearly increased according to the number of screw rotations. That is, the paste containing metal nanoparticles can be applied in a controlled amount by the number of screw rotations. In the range of the number of screw rotations, a stable application shown in FIG. 4 is possible. The viscosity of the paste containing metal nanoparticles is preferably 100 to 1600 Pa·s at 1 rpm, 50 to 900 Pa·s at 3 rpm, 50 to 450 Pas at 5 rpm, 50 to 150 Pa·s at 10 rpm, and 50 Pa·s or less at 15 rpm. It is preferable that the viscosity of the paste containing metal nanoparticles is in that range because the control of the application amount is easy, an appropriate amount of the paste is applied so that a short circuit is less likely to occur, and the deterioration of the power generation amount of the thermoelectric conversion module is easily suppressed.

Figure 5:
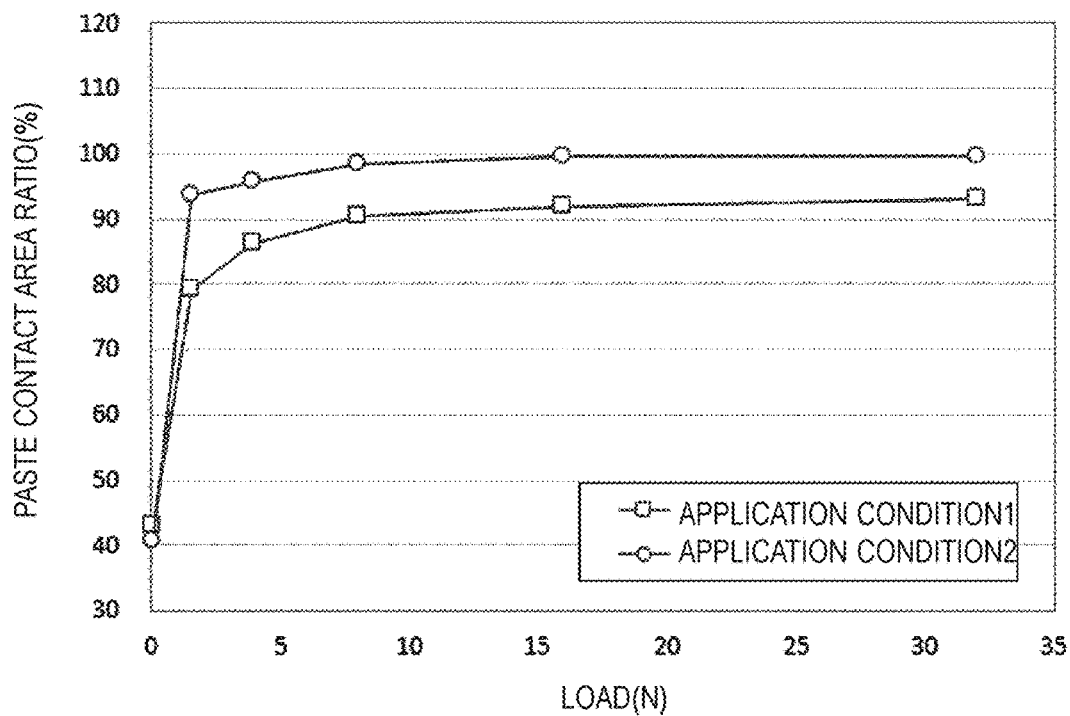
FIG. 5 is a diagram showing a relationship between a pressing load and a contact area ratio of a paste containing metal nanoparticles.

As an assembly method of the thermoelectric conversion module, it is preferable to apply the paste containing metal nanoparticles onto the thermoelectric conversion element using the mechanical dispenser and dispose the thermoelectric conversion element and the conductive member using the mounter. Further, it is more preferable to compress and spread the paste containing metal nanoparticles when disposing the thermoelectric conversion element or the conductive member. Since the mounter can suck the member using the suction nozzle and mount the member at a specified position, the assembly accuracy is high. In addition, when mounting the member at a predetermined position, it is possible to adjust the height at the time of mounting and to adjust the load at the time of mounting by using a spring type nozzle. That is, the metal nanoparticle paste applied by mechanical dispenser at the time of mounting the member can be spread with a predetermined load. Hereinafter, the load required for spreading the metal nanoparticle paste will be described as a paste load. FIG. 5 shows a relationship between the pressing load and the contact area ratio of the paste containing metal nanoparticles. The paste contact area ratio (%) refers to the ratio of the area of the paste containing metal nanoparticles applied and spread on the conductive member with respect to the area of the joint surface (here, 4 mm×4 mm) of the thermoelectric conversion element. Further, the application condition 1 and the application condition 2 shown in FIG. 5 refer to a case in which the application amount is changed. The paste contact area ratio refers to the macroscopic joint area and does not include pores (voids) in the joint area when viewed microscopically. The mounting load is 1.6 N, 4 N, 8 N, 16 N, and 32 N, respectively. As shown here, the contact area ratio increases sharply from the initial paste contact area ratio (load of 0 N) applied by the mechanical dispenser to 1.6 N. After that, even if the load is increased, it does not rise linearly. When a certain load is exceeded, the paste containing metal nanoparticles is difficult to spread.

Since the pattern applied by the mechanical dispenser independently exists one or more with respect to the joint surface of one thermoelectric conversion element or the conductive member, a surface pressure (Pa) is applied to each pattern group with a small application area. Therefore, even when the load is small, the local surface pressure becomes high, and the contact area can be rapidly expanded. On the other hand, when the mounting load is 4 N or more, an increase rate of the paste contact area ratio with respect to an increase in load is small. Depending on the application condition, the contact area ratio does not greatly exceed 100% even when the mounting load of 32 N (2 MPa in terms of element area of 4 mm×4 mm) is applied. Since the independent application patterns existing individually are fused by pressurization after 1.6 N, the surface pressure is dispersed. Therefore, the paste contact area does not increase more than necessary even when the load increases. That is, when the second conductive member is compressed, the paste containing metal nanoparticles on the thermoelectric conversion element mainly spreads and the spread area of the paste containing metal nanoparticles of the first conductive member hardly changes. Therefore, it is unlikely that a short circuit or the like will occur due to the protruding of the paste. Therefore, it is possible to suppress the paste on the first conductive member which has been compressed first from being excessively spread by the step of compressing the paste after applying the paste containing metal nanoparticles onto the upper surface of the thermoelectric conversion element due to the relationship between the load and the paste contact area ratio shown in FIG. 5. Furthermore, even when the paste is excessively pressurized due to the influence of the jig or the like, it is possible to suppress the paste from spreading excessively. Thus, it is preferable because the short circuit of the thermoelectric conversion module can be suppressed. Furthermore, it is preferable to apply the paste to a plurality of positions on the joint surface of the thermoelectric conversion element or a position assuming an expanding shape because the shape of the joining member is easily controlled. For example, when the joint surface of the thermoelectric conversion element 20 has a shape (rectangular shape, square shape) having four corner parts, it is preferable to apply the paste to a position extending from the center part to each corner part because the paste spreads to four corners parts.

In (f) of FIG. 2, the paste containing metal nanoparticles disposed between the thermoelectric conversion element and the conductive member is sintered. Since the sinterability of the metal nanoparticles is improved by the reduction reaction, it is more preferable to join in an atmosphere showing a reduction reaction such as a mixed atmosphere of nitrogen and hydrogen or hydrogen. The pressurization in the direction perpendicular to the upper surface and the lower surface of the thermoelectric conversion element when the joining temperature is in the range of 300 to 400° C. is preferably in the range larger than 0 MPa and equal to or smaller than 2 MPa and more preferably in the range of 0.1 to 0.5 MPa. Since the metal nanoparticles that are the joining members can be in close contact with each other and the material to be joined (the diffusion prevention layer and the conductive member formed on the surface of the thermoelectric conversion element) can be in close contact with each other by the pressurization during sintering, sintering is easier to proceed and the joining strength is improved. The above pressurization range is within the range shown in FIG. 3, and excessive protrusion of the paste containing metal nanoparticles is unlikely to occur even in the pressurization during sintering. Since the joint area of the metal nanoparticles can be controlled when mounted on the mounter, it is possible to prevent a decrease in joining strength due to insufficient joint area.

A preferable embodiment of the joining member will be described below.

First, it is preferable that the paste contact area ratio of the joining member is 50% or more and 100% or less in consideration of the heat conduction of the joining member. 50% or more is preferable because the heat conducted from the conductive member can be sufficiently conducted to the thermoelectric conversion element and 100% or less is preferable because the short circuit due to the excessive protrusion of the joining member can be prevented. Further, 85% or more is preferable, and 95% or more is more preferable.

Figure 6:
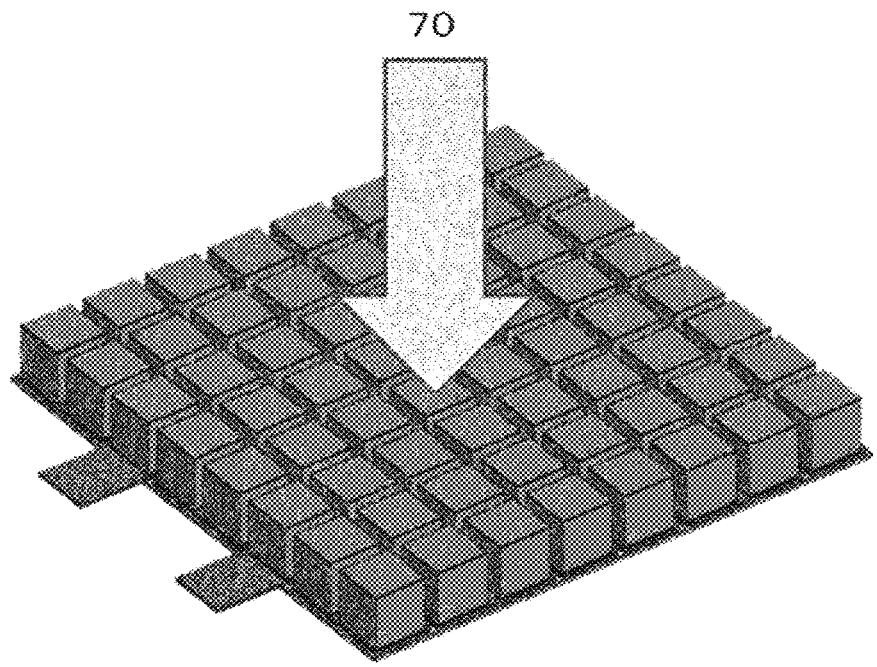
FIG. 6 is a perspective view showing a photographing direction of a microscope of FIG. 15.
Figure 15:
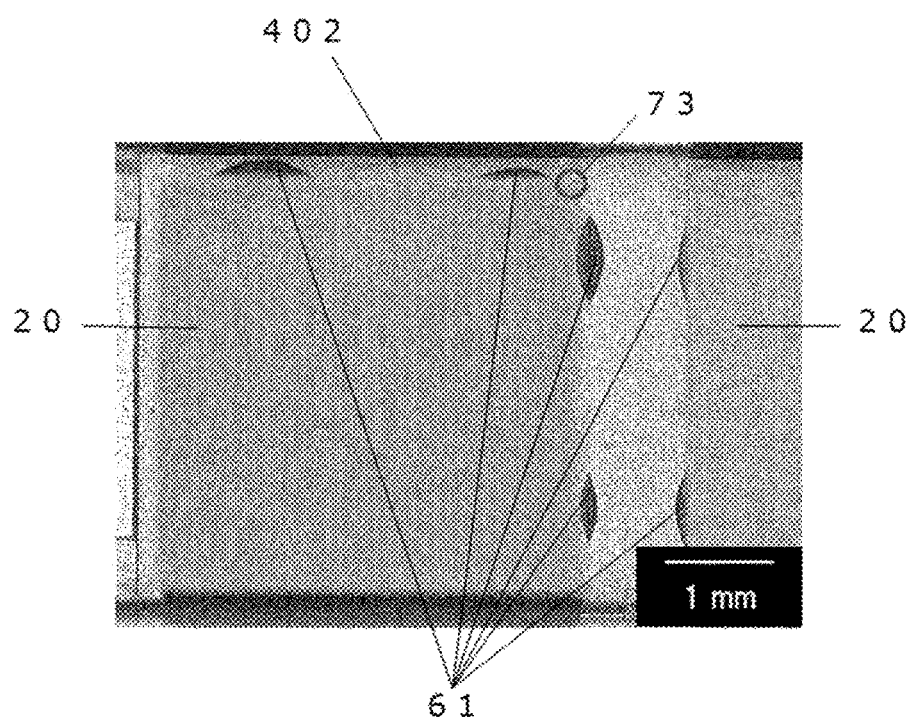
FIG. 15 is a microscope image showing an enlarged shape of the paste containing metal nanoparticles.

The joining member extending within the range of the first or second conductive member of the thermoelectric conversion module when viewed from above is preferable because the joining member does not short circuit with another adjacent conductive member. This is because the paste containing metal nanoparticles before sintering is in a state of spreading at least within the range where the first or second conductive member is viewed from above and can be formed by maintaining the state even after sintering. As an example, FIG. 6 shows a photograph obtained by observing the first conductive member in the top view from the thermoelectric conversion element after the step of disposing the thermoelectric conversion element on the paste containing metal nanoparticles applied onto the first conductive member and compressing and spreading the paste containing metal nanoparticles in the fourth example to be described below. FIG. 6 shows the observation direction 70 of the microscope, and FIG. 15 shows the observation image. At this time, it can be seen that the spread of the paste of the joining member protruding from the range of the thermoelectric conversion element is within the range of the first conductive member. More preferably, it is possible to more reliably prevent a short circuit by applying the paste within the range of the thermoelectric conversion element. If the paste containing metal nanoparticles protrudes from the first conductive member, it leads to a short circuit. If a short circuit occurs, it will be a parallel circuit, which will lead to a decrease in output density. Therefore, in the examples described later, it is described as good when there is no protrusion of the paste containing metal nanoparticles from the first conductive member and as poor when there is protrusion.

Further, in FIG. 6, the structure is such that the paste containing metal nanoparticles does not come into contact with the corner part 73 of the thermoelectric conversion element (the back surface side is the diffusion prevention layer). Therefore, it is preferable because the concentration of stress on the corner parts of the thermoelectric conversion element can be suppressed when a temperature difference occurs in the thermoelectric conversion module. When the joining stress is applied during the operation of the thermoelectric conversion module, the stress is locally concentrated on the changed part of the shape. It is important to slow down the change in shape in order to suppress stress concentration. After preparing a sintered body, the thermoelectric conversion material is made into a prismatic thermoelectric conversion element using a multi-wire saw or the like. Therefore, stress concentration tends to occur at the corner parts of the thermoelectric conversion element. If the paste containing metal nanoparticles does not come into contact with the corner parts of the thermoelectric conversion element, the joint will change shape slowly. Accordingly, it is possible to reduce the thermal stress applied to the thermoelectric conversion element or the diffusion prevention layer compared to a case in which the paste is applied to the entire joint surface. That is, it is possible to form a thermoelectric conversion module structure with high output density without causing the diffusion prevention layer and the thermoelectric conversion element to be destroyed. In such a thermoelectric conversion module, preferably, the first conductive member, the thermoelectric conversion element, and the second conductive member are joined by the joining member, the joining member has a predetermined controlled amount, the thermoelectric conversion element has a corner part in a cross-sectional shape, and the joining member is spread in the range excluding at least a part of the corner part of the thermoelectric conversion element. In particular, in FIG. 6, the range preferably excludes all four corners.

Hereinafter, a case in which the paste contact area ratio of the joining member is 70% or more and 100% or less will be described as a preferable embodiment of the joining member.

Figure 7:
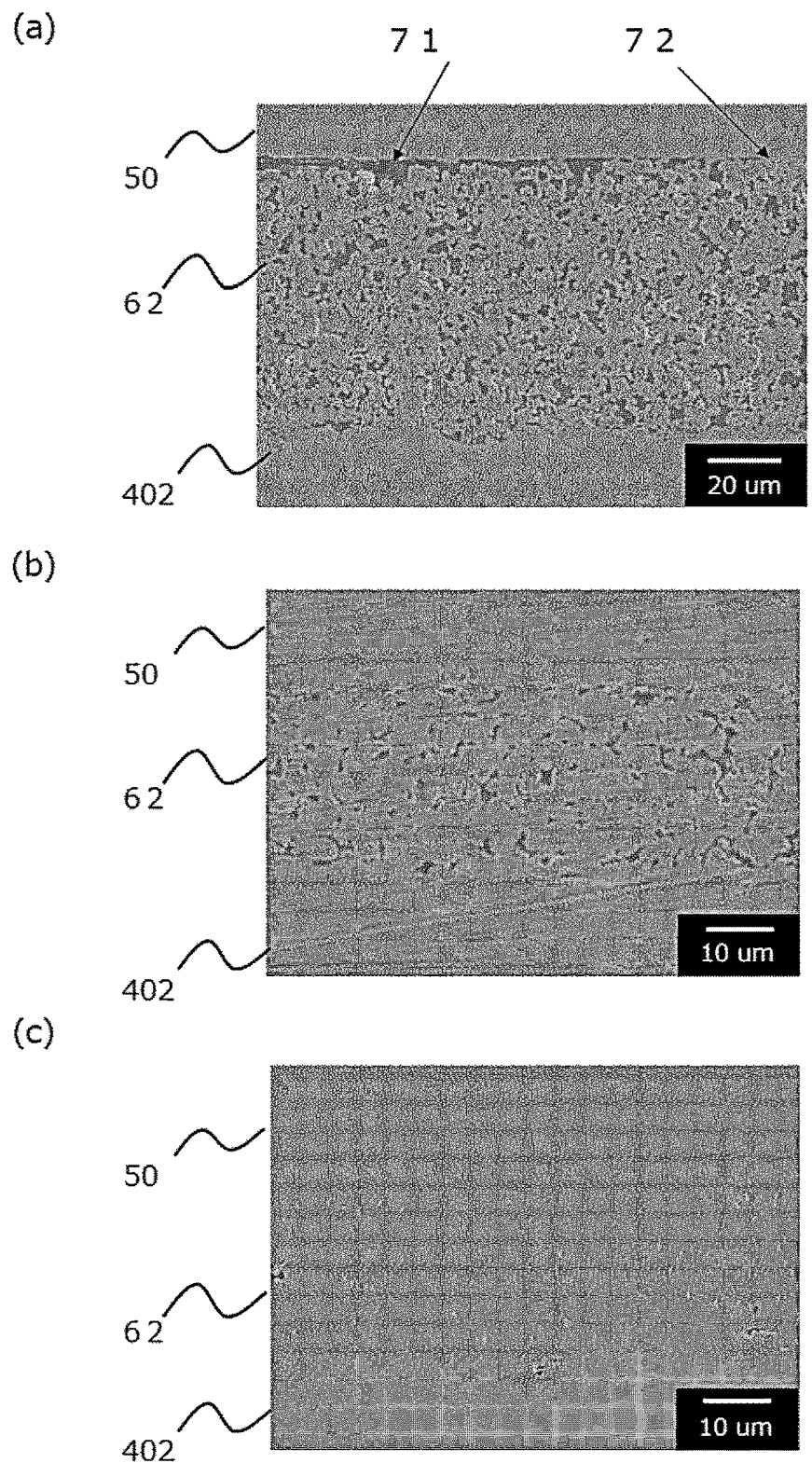
FIG. 7 is a scanning electron microscope image of a cross-section of a joining member.

The thickness of the joint layer formed between the thermoelectric conversion element and the conductive member is defined as the thickness of the joining member. At this time, the thickness is preferably 5 μm or more and 80 μm or less. More preferably, the thickness of the joining member is 5 μm or more and 30 μm or less. If it is 5 μm or more, since the amount discharged to the outside of the thermoelectric conversion element is small, it is possible to prevent a short circuit state. If it is 80 μm or less, it is preferable because an unjoined part is less likely to occur at the joint interface due to appropriate pressurization at the time of joining and heat from the first and second conductive members is easily conducted to the thermoelectric conversion element. When the thickness is 30 μm or less, it is preferable because the unjoined part of the joint interface is further reduced and hence the joining strength is improved. (a) of FIG. 7 is a cross-sectional observation image of a part of the joined part of the fourth example to be described later and the joint thickness is 80 μm. Although a partially unjoined part 71 is generated at the joint interface, it also has a joined part 72. Therefore, the output density is 1.6 W/cm$^2$ and it is considered that there is no problem with heat conduction and conduction. On the other hand, since it has a low-density joined part, the deformability of the joined part itself is improved, and a stress relaxation effect can be expected. (b) of FIG. 7 is a cross-sectional observation image of a part of the joined part of the seventh example to be described later, and the joint thickness is 30 μm. (c) of FIG. 7 is a cross-sectional observation image of another joined part of the same seventh example, and the joint thickness is 20 μm. In each case, almost no unjoining occurred at the joint interface.

The thermal stress applied to the joining member of the thermoelectric conversion module will be described below. The thermoelectric conversion module was joined in the application shape shown in FIG. 9, and the thermal stress applied to the thermoelectric conversion element when the temperature changed from 350° C. to 25° C. was calculated by finite element analysis. The thermal stress ratio was 0.52 with respect to the application shape shown in FIG. 8. In the present invention, since precise application is possible when disposing the paste containing metal nanoparticles, it is possible to control the application shape. Therefore, it is possible to manufacture the thermoelectric conversion module having high thermal stress resistance when manufacturing the thermoelectric conversion module having high output density. In addition, the paste contact area ratio in this case is 90%. When the paste contact area ratio is 90% or less, the effect of reducing the thermal stress can be expected. Then, when the paste contact area ratio is 70% or less, the thermal stress applied to the thermoelectric conversion element or the barrier layer can be further reduced. The joint area may be appropriately adjusted in accordance with the thermal stress applied to the joining member itself. It is considered that an increase in the stress applied to the joining member itself can be suppressed while reducing the thermal stress applied to the thermoelectric conversion element or the diffusion prevention layer by adjusting the joint area.

Figure 10:
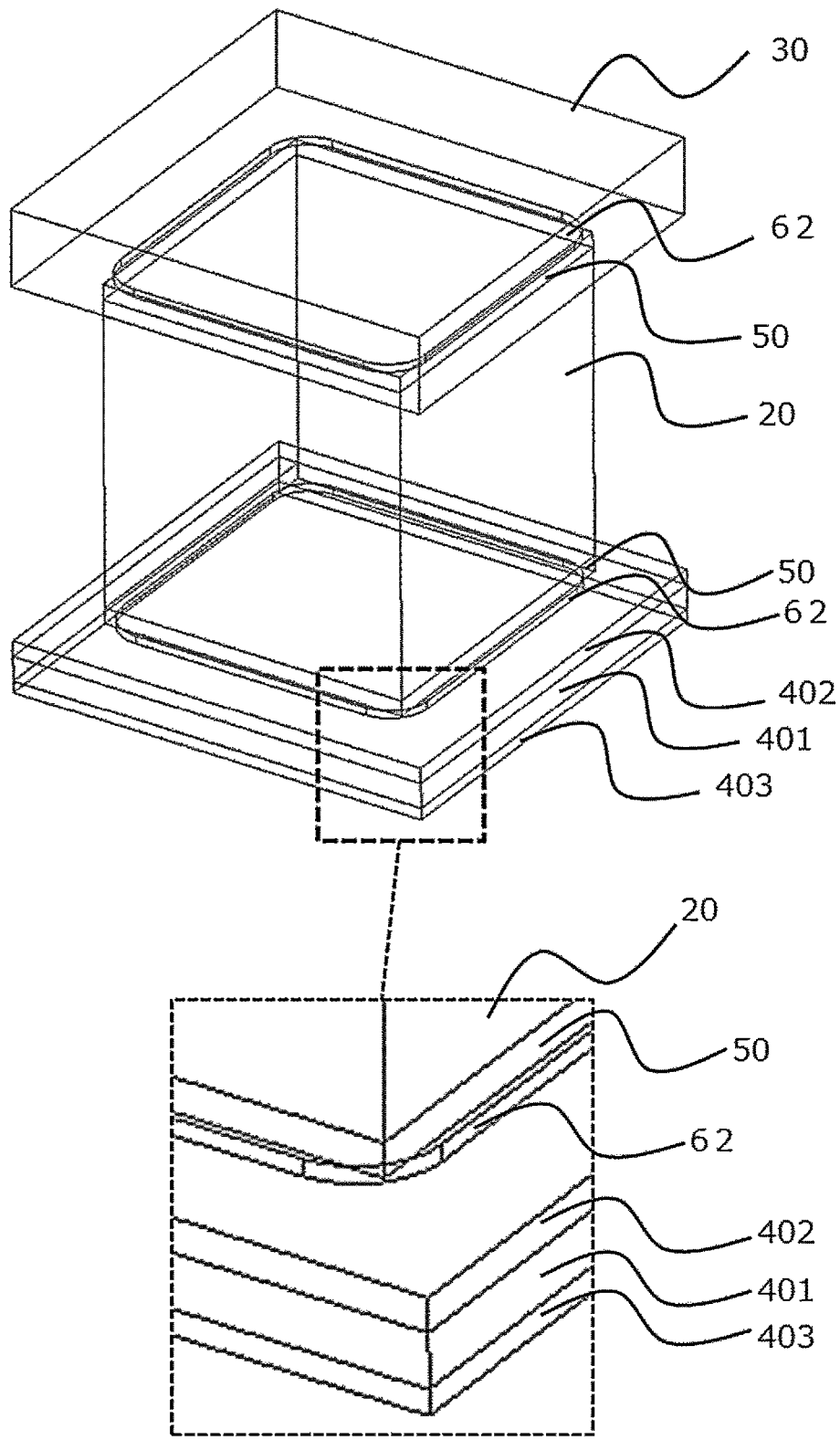
FIG. 10 is a transmission diagram schematically showing an example of the shape of the joining member.

The thermal stress when changing the shape of the joining member of the method for manufacturing the thermoelectric conversion module will be described below. The thermoelectric conversion module was joined in the application shape shown in FIG. 10 and the thermal stress applied to the thermoelectric conversion element when the temperature changed from 350° C. to 25° C. was calculated by finite element analysis. In the application shape of FIG. 8, the thermal stress ratio was 0.65. That is, since metal nanoparticle paste spreads to the range excluding the corner part of the thermoelectric conversion element, it is possible to manufacture the thermoelectric conversion module having high thermal stress resistance. Additionally, the paste contact area ratio in this case was 98%.

In the present invention, it is considered that various effects can be obtained by appropriately adjusting the conditions and the like aiming at the preferable form of the joining member described above.

EXAMPLES

The first example of the method for manufacturing the thermoelectric conversion module will be described below. Hereinafter, the results of the first to ninth examples are summarized in Table 1. In the following examples, silicon nitride was used for the ceramic substrate from the viewpoint of strength and thermal conductivity, and the first conductive member and the metal layer were formed by brazing a copper plate to the ceramic substrate and performing a treatment such as etching.

In this example, an eight-pair thermoelectric conversion module using eight P-type thermoelectric conversion elements and eight N-type thermoelectric conversion elements was prepared. The external size is 20 mm×20 mm×5.8 mm.

A circuit pattern of the first conductive member was formed to connect eight thermoelectric conversion elements in series. After installing the ceramic substrate on which the circuit pattern was formed on the jig for transferring to the mounter, the paste containing metal nanoparticles was applied onto the first conductive member by the mechanical dispenser in the mounter. Copper is used as the metal nanoparticles, and is sometimes referred to as copper nanoparticle paste hereafter. The paste was used in which the viscosity of the copper nanoparticle paste was adjusted to 400 Pa·s at 1 rpm, 100 Pa·S at 3 rpm, 91 Pa·s at 5 rpm, 63 Pa·s at 10 rpm, and 50 Pa·s at 15 rpm. The copper nanoparticle paste was applied to the joint surface of the thermoelectric conversion element at equal intervals in a total of nine positions. The number of screw rotations at the time of dispensing was 10 rpm.

As the copper nanoparticle paste, copper nanoparticles for joining purposes were used. The mass concentration of the copper nanoparticles in the paste with respect to the total mass of the paste was set to 87 mass %. Diethylene glycol monobutyl ether was used as the main solvent and dispersant. Polyethylene glycol having an average molecular weight of 400 was used as a thickener. In the copper nanoparticle paste, the volume ratio of only the solvent excluding the copper nanoparticles was 60 vol % for the dispersant and 40 vol % for the thickener, and the paste was kneaded and prepared using a rotating and revolving kneader.

When preparing the copper nanoparticle paste, as an element experiment, the sediment separation property was evaluated by a sedimentation test to confirm the effect of adding a thickener to diethylene glycol monobutyl ether as a main solvent and dispersant. It was evaluated in a system in which the total volume of diethylene glycol monobutyl ether and polyethylene glycol was 100 vol %, the volume ratio of polyethylene glycol was 0 vol %, 20 vol %, 40 vol %, 60 vol %, 80 vol %, and copper nanoparticles were dispersed in 0.1 mass %. As shown in Table 2, in the system in which the mixing ratio of polyethylene glycol was 0 vol % and 20 vol %, sedimentation of particles was confirmed in one day. However, in the system in which the mixing ratio of polyethylene glycol was 40 vol % or more, it was confirmed that it took ten days or more for the particles to completely sediment. In the system with a high particle concentration such as paste, interference sedimentation occurs, and it is considered that the system is difficult to separate for a longer time because the sedimentation rate is slower than the free sedimentation as tested in a dilute system. When the system is difficult to separate, it is considered to be a system that has a long life time as a paste and can be discharged more stably. From the above, polyethylene glycol is preferably more than 20 vol %, specifically, 40 vol % or more, and the thickener of 40 vol % was selected.

Further, an element experiment for applying the paste containing metal nanoparticles in the method for manufacturing the thermoelectric conversion module will be described below. A copper nanoparticle paste was applied as a paste containing metal nanoparticles on a ceramic substrate on which a circuit pattern was formed without performing module assembly. The used copper nanoparticle paste was the same as in the first example. At this time, the number of screw rotations at the time of dispensing was 15 rpm. The circuit pattern was continuously applied to three hundred twenty positions, and it was confirmed whether or not there was an application defect on a total of four boards. Immediately after injecting the copper nanoparticle paste into the syringe for dispensing, one that was allowed to stand for three days and one that was allowed to stand for eighteen days were prepared. Then, it was confirmed that no unapplied paste occurred when each was applied. From this result, it is considered that the thermoelectric conversion module can be manufactured by applying the copper nanoparticle paste even when the number of screw rotations is changed.

For comparison of element experiments, a paste prepared using only diethylene glycol monobutyl ether without thickener and copper nanoparticles was used. Immediately after injecting the copper nanoparticle paste into the syringe for dispensing, one that was allowed to stand for three days and one that was allowed to stand for eighteen days were prepared. After continuous application was performed on 320 positions for each of them, it was confirmed whether or not there was an application defect on a total of four substrates. In the sample allowed to stand for eighteen days, there was a variation in the application amount up to the 320th position, and the syringe was clogged at the application of the 321st position. Then, the subsequent application could not be performed.

The thermoelectric conversion element each composed of the P-type thermoelectric conversion element (Fe—Sb-based scutterdite) and the N-type thermoelectric conversion element (Co—Sb-based scutterdite) and having a dimension of 4 mm×4 mm×4 mm was used. The P-type thermoelectric conversion element and the N-type thermoelectric conversion element are mounted on the copper nanoparticle paste by the mounter so that the elements are alternately arranged. The load at the time of mounting in the mounter was adjusted to about 1.6 N, and the copper nanoparticle paste was spread on the joint surface of the P-type thermoelectric conversion element and the N-type thermoelectric conversion element by the mounting load. Then, the copper nanoparticle paste was applied to the upper surfaces of the P-type thermoelectric conversion element and the N-type thermoelectric conversion element by the mechanical dispenser. The application pattern is the same as the pattern applied on the first conductive member. Then, the second conductive member was mounted on the same copper nanoparticle paste by the mounter with a clearance of 0.4 mm to prepare a thermoelectric conversion module assembly. The second conductive member is a composite metal conductive member containing copper and molybdenum as main elements in consideration of the linear expansion coefficient of the P-type thermoelectric conversion element and the N-type thermoelectric conversion element and has a size of 9.6 mm×4.6 mm.

As shown in FIG. 3, the diffusion prevention layer was formed on the upper and lower surfaces of the P-type thermoelectric conversion element and the N-type thermoelectric conversion element and the diffusion prevention layer and the copper nanoparticle paste are substantially brought into contact with each other to form the joint layer of the joining member. In this example, the diffusion prevention layer was formed as a two-layer structure composed of a layer containing components of the thermoelectric conversion element and aluminum-titanium and having a thickness of 200 μm and a nickel layer having a thickness of 100 μm from the surface side of the thermoelectric conversion element. The joining temperature was 350° C., the joining holding time was 15 minutes, the joining atmosphere was a hydrogen atmosphere, and the joining pressure was 0.5 MPa.

Figure 8:
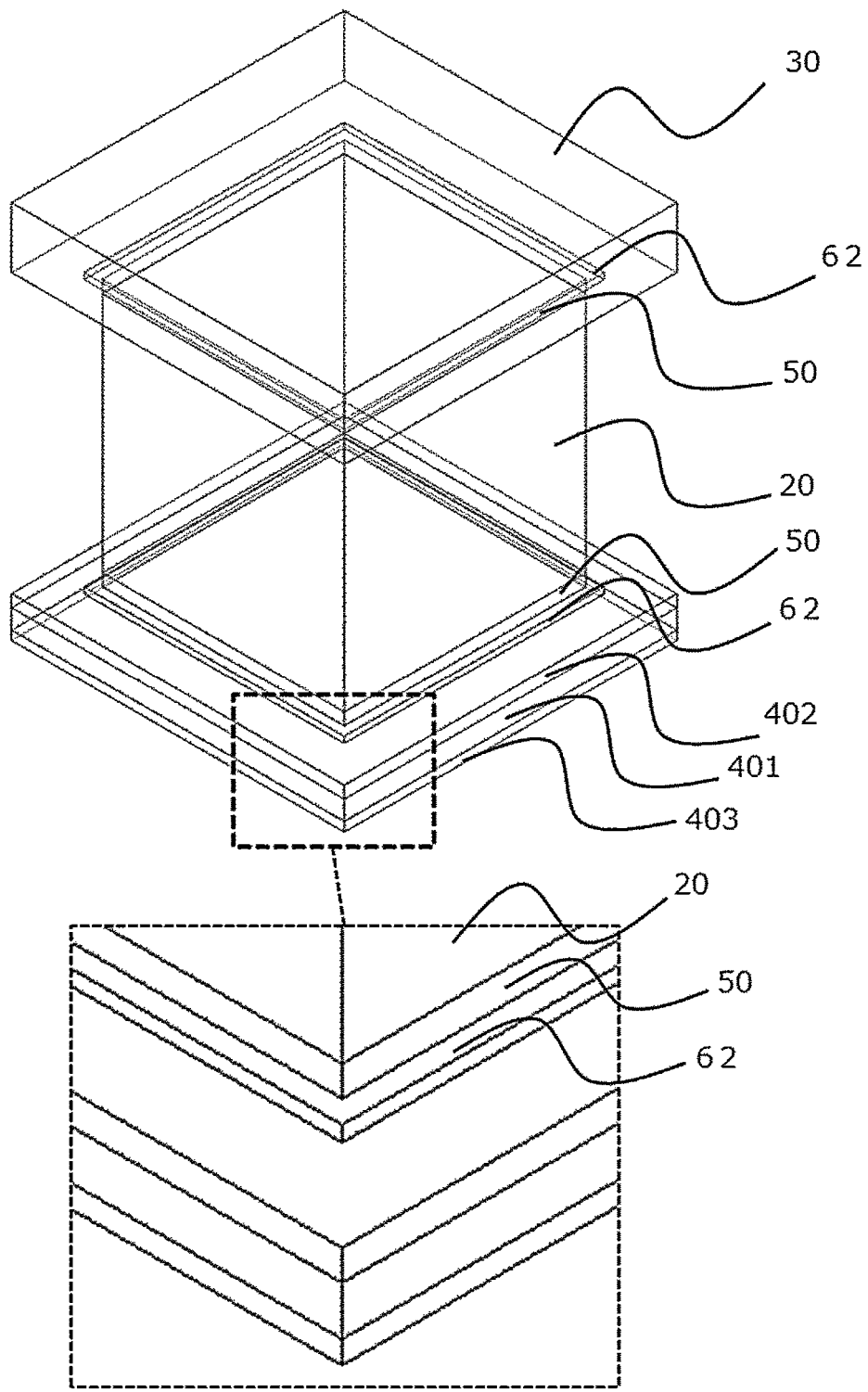
FIG. 8 is a transmission diagram schematically showing an example of the shape of the joining member.
Figure 9:
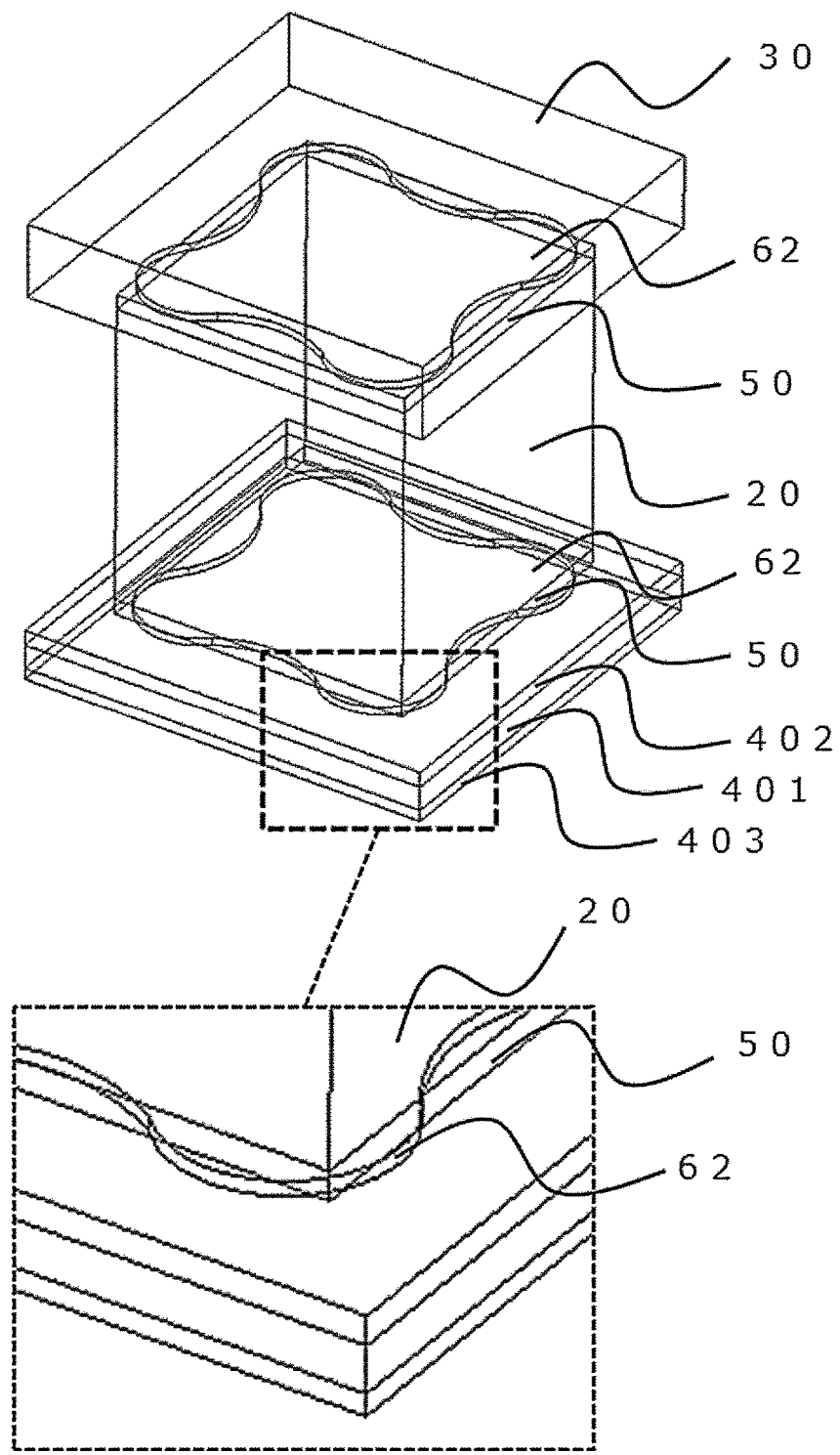
FIG. 9 is a transmission diagram schematically showing an example of the shape of the joining member.

The performance was measured by sandwiching the upper and lower surfaces of the thermoelectric conversion module between the heating block and the cooling block and giving a temperature difference while pressurizing. At this time, if the temperatures of the upper and lower surfaces of the thermoelectric conversion module are respectively set to the high temperature side temperature and the low temperature side temperature of Table 1 when the measured pressure for pressurization is 1 MPa, an output of 1.94 W/cm$^2$ can be obtained. Accordingly, it is possible to manufacture the thermoelectric conversion module having a high power generation output. FIG. 8 shows how the copper nanoparticles spread in the case of the first example. Here, it is shown schematically through the thermoelectric conversion element or the like. In this case, the joint area of the copper nanoparticles is 100% with respect to the joint area of the thermoelectric conversion element.

The second example of the method for manufacturing the thermoelectric conversion module will be described below. The manufacturing method is the same as that of the first example. In this example, the performance evaluation of the thermoelectric conversion module was performed at a measured pressure of 2 MPa and the other conditions are shown in Table 1. It is possible to manufacture the thermoelectric conversion module capable of obtaining an output of 2.68 W/cm$^2$ and having a high power generation output even in a high pressure environment.

The third example of the method for manufacturing the thermoelectric conversion module will be described below. The manufacturing method is the same as that of the first example. In this example, the performance evaluation of the thermoelectric conversion module was performed at a measured pressure of 3 MPa and the other conditions are shown in Table 1. It is possible to manufacture the thermoelectric conversion module capable of obtaining an output density of 2.76 W/cm$^2$ even in a pressure environment higher than the second example and having a high power generation output even in a higher pressure environment.

The fourth example of the method for manufacturing the thermoelectric conversion module will be described below. In this example, the thermoelectric conversion module shown in FIG. 1 was prepared. A circuit pattern of the first conductive member 402 was formed for the serial connection by using thirty two P-type thermoelectric conversion elements 201 and thirty two N-type thermoelectric conversion elements 202. The copper nanoparticle paste 61 was applied as a pattern to the joint surface of the thermoelectric conversion element 20 at one position of the center and four positions of four corner parts. The joining temperature was 350° C. and the joining pressure was 0.1 MPa. Other conditions are the same as in the first example. It is possible to manufacture the thermoelectric conversion module capable of obtaining an output density of 1.56 W/cm$^2$ and having a high power generation output even when the size of the thermoelectric conversion module is large.

The fifth example of the method for manufacturing the thermoelectric conversion module will be described below. The joining pressure was 0.5 MPa. The performance evaluation of the thermoelectric conversion module was performed at the high temperature side temperature of 300° C. and the low temperature side temperature of 50° C. Other conditions are the same as in the fourth example. It is possible to manufacture the thermoelectric conversion module capable of obtaining an output density of 0.65 W/cm$^2$ and generating power even when the difference between the high temperature side temperature and the low temperature side temperature is small.

The sixth example of the method for manufacturing the thermoelectric conversion module will be described below. The performance evaluation of the thermoelectric conversion module was performed at the high temperature side temperature of 400° C. and the low temperature side temperature of 50° C. Other conditions are the same as in the fourth example. It is possible to manufacture the thermoelectric conversion module in which the output density is 1.29 W/cm$^2$ and the output density becomes higher when the difference between the high temperature side temperature and the low temperature side temperature becomes larger.

The seventh example of the method for manufacturing the thermoelectric conversion module will be described below. The performance evaluation of the thermoelectric conversion module was performed at the high temperature side temperature of 500° C. and the low temperature side temperature of 50° C. Other conditions are the same as in the fourth example. It is possible to manufacture the thermoelectric conversion module in which the output density is 2.21 W/cm$^2$ and the output density becomes higher when the difference between the high temperature side temperature and the low temperature side temperature becomes larger.

The eighth example of the method for manufacturing the thermoelectric conversion module will be described below. The performance evaluation of the thermoelectric conversion module was performed at the high temperature side temperature of 600° C. and the low temperature side temperature of 50° C. Other conditions are the same as in the fourth example. It is possible to manufacture the thermoelectric conversion module in which the output density is 3.21 W/cm$^2$ and the output density becomes higher when the difference between the high temperature side temperature and the low temperature side temperature becomes larger.

The ninth example of the method for manufacturing the thermoelectric conversion module will be described below. The number of screw rotations at the time of dispensing was 5 rpm. The performance evaluation was performed at the high temperature side temperature of 500° C. and the low temperature side temperature of 50° C. Other conditions are the same as in the fourth example. It is possible to manufacture the thermoelectric conversion module in which the output density 2.00 W/cm$^2$ and the output density becomes higher even when the number of screw rotations is 5 rpm.

Figure 11:
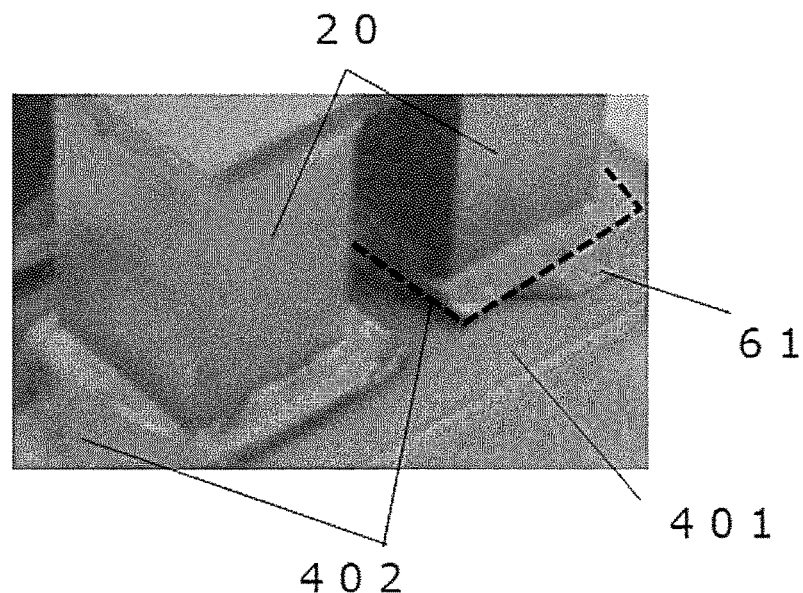
FIG. 11 is an enlarged microscope image of a part of a thermoelectric conversion module of a comparative example.

As a comparative example, the thermoelectric conversion module was prepared by applying a copper nanoparticle paste by printing without using the mechanical dispenser in the step of applying the copper nanoparticle paste onto the first conductive member and the thermoelectric conversion element. Other conditions are as shown in Table 1. The output density was 0.9 W/cm$^2$ and the output density was lower than those of the first example, the fourth example, the seventh example, and the ninth example in which the high temperature side temperature and the low temperature side temperature were the same and the measured pressure was the same. FIG. 11 is an enlarged photograph of a part of the thermoelectric conversion module after joining. The dotted line part in FIG. 11 shows the outline of the copper plate 402 which is the first conductive member and the copper nanoparticle paste 61 to which the thermoelectric conversion element 20 is joined protrudes from the copper plate 402 and reaches the region of the ceramic substrate 401. Since the amount of the applied copper nanoparticle paste is not controlled, it is considered that the output density is lowered because the short circuit of the thermoelectric conversion module is prone to occur.

As a tenth example, a reliability test was performed on the thermoelectric conversion module in which the ceramic substrate was made of zirconia-reinforced alumina using the same manufacturing method as that of the first example. The conditions of the reliability test are described below.

Figure 13:
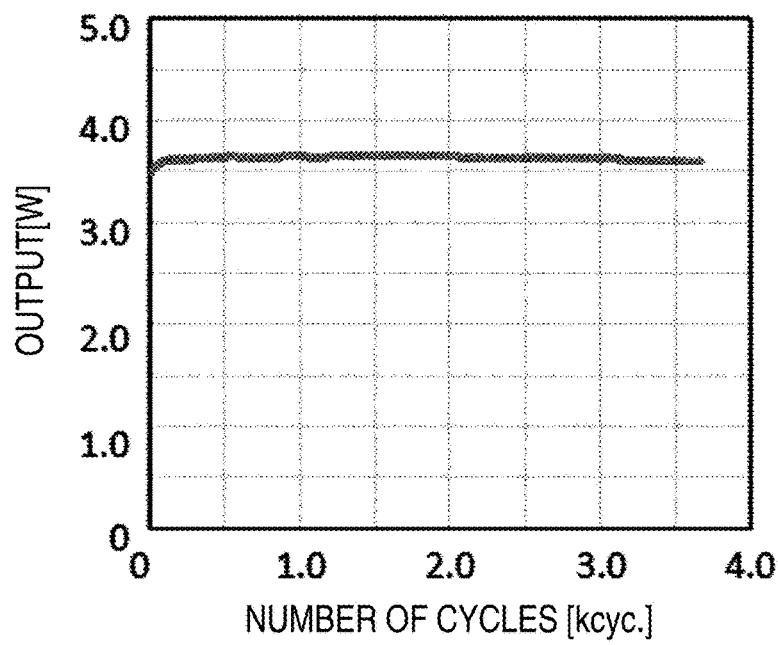
FIG. 13 is a correlation diagram between a cycle and an output of the thermodynamic conversion module during the thermal cycle.

In the reliability test, the upper and lower surfaces of the thermoelectric conversion module were sandwiched and pressurized by the heating block and the cooling block to give a temperature difference thereto, the thermal cycle load was applied to the high temperature side surface of the thermoelectric conversion module contacting the heating block, and the constant cooling capacity of the cooling block was maintained. Then, a change in the power generation performance was evaluated. The pressurization was 1 MPa and one cycle of the thermal cycle was set such that the load at the high temperature of the heating block side was 400° C. was changed to the load at the low temperature thereof was 150° C. The cooling capacity was adjusted so that the cooling block side was 50° C. when the heating block side was 400° C. and the cooling block side was 45° C. when the heating block side was 150° C. FIG. 13 shows an output change at the time of reliability evaluation. Measurements were made up to 3650 cycles, the output deterioration from the maximum output was 2% or less, the overall variation was small, and sufficient reliability was confirmed.

Although the present invention has been described above with reference to examples, the present invention is not limited thereto. The effects of the present invention can be fully exhibited even when various combinations of the examples are used.

TABLE 1

|  | MODULE AREA ($cm^2$) | APPLICATION POSITION | JOINING TEMPERATURE (° C.) | JOINING PRESSURE (MPa) | MEASURED PRESSURE (MPa) |
| --- | --- | --- | --- | --- | --- |
| EXAMPLE 1 | 2 × 2 | 9 POSITIONS OF ELEMENT SURFACE | 350 | 0.5 | 1 |
| EXAMPLE 2 | 2 × 2 | 9 POSITIONS OF ELEMENT SURFACE | 350 | 0.5 | 2 |
| EXAMPLE 3 | 2 × 2 | 9 POSITIONS OF ELEMENT SURFACE | 350 | 0.5 | 3 |
| EXAMPLE 4 | 4 × 4 | 5 POSITIONS OF ELEMENT SURFACE | 350 | 0.1 | 1 |
| EXAMPLE 5 | 4 × 4 | 5 POSITIONS OF ELEMENT SURFACE | 350 | 0.5 | 1 |
| EXAMPLE 6 | 4 × 4 | 5 POSITIONS OF ELEMENT SURFACE | 350 | 0.5 | 1 |
| EXAMPLE 7 | 4 × 4 | 5 POSITIONS OF ELEMENT SURFACE | 350 | 0.5 | 1 |
| EXAMPLE 8 | 4 × 4 | 5 POSITIONS OF ELEMENT SURFACE | 350 | 0.5 | 1 |
| EXAMPLE 9 | 4 × 4 | 5 POSITIONS OF ELEMENT SURFACE | 350 | 0.5 | 1 |
| COMPARATIVE EXAMPLE | 2 × 2 | ENTIRE ELEMENT SURFACE | 350 | 0.5 | 1 |

|  | ELEMENT HIGH TEMPERAURE SIDE TEMPERATURE (° C.) | ELEMENT LOW TEMPERAURE SIDE TEMPERATURE (° C.) | APPEARANCE | OUTPUT DENSITY IN TERMS OF ELEMENT AREA ($W/cm^2$) |
| --- | --- | --- | --- | --- |
| EXAMPLE 1 | 500 | 50 | GOOD | 1.94 |
| EXAMPLE 2 | 500 | 50 | GOOD | 2.68 |
| EXAMPLE 3 | 500 | 50 | GOOD | 2.76 |
| EXAMPLE 4 | 500 | 50 | GOOD | 1.56 |
| EXAMPLE 5 | 300 | 50 | GOOD | 0.65 |
| EXAMPLE 6 | 400 | 50 | GOOD | 1.29 |
| EXAMPLE 7 | 500 | 50 | GOOD | 2.21 |
| EXAMPLE 8 | 600 | 50 | GOOD | 3.21 |
| EXAMPLE 9 | 500 | 50 | GOOD | 2.00 |
| COMPARATIVE EXAMPLE | 500 | 50 | BAD | 0.90 |

TABLE 2

| | 0 vol % | 20 vol % | 40 vol % | 60 vol % | 80 vol % |
|---|---|---|---|---|---|
| INITIAL | DISPERSION | DISPERSION | DISPERSION | DISPERSION | DISPERSION |
| AFTER 1 DAY | SEDIMENTATION | SEDIMENTATION | DISPERSION | DISPERSION | DISPERSION |
| AFTER 6 DAYS | SEDIMENTATION | SEDIMENTATION | DISPERSION | DISPERSION | DISPERSION |
| AFTER 10 DAYS | SEDIMENTATION | SEDIMENTATION | PARTIAL SEDIMENTATION | PARTIAL SEDIMENTATION | DISPERSION |
| AFTER 30 DAYS | SEDIMENTATION | SEDIMENTATION | PARTIAL SEDIMENTATION | PARTIAL SEDIMENTATION | DISPERSION |

The invention claimed is:

1. A method for manufacturing a thermoelectric conversion module in which a first conductive member, a thermoelectric conversion element, and a second conductive member are joined by a joining member, comprising:
    applying a first paste containing copper nanoparticles onto the first conductive member, disposing the thermoelectric conversion element on the first paste, and compressing and spreading the first paste;
    applying a second paste containing copper nanoparticles onto the thermoelectric conversion element in a controlled amount, disposing the second conductive member, and compressing and spreading the second paste; and
    sintering the first paste and the second paste to obtain the joining member,
    wherein the first paste and the second paste have a relationship between a shear rate and a viscosity such that an inclination on a side with a large shear rate is smaller than an inclination on a side with a small shear rate,
    wherein a mechanical dispenser having a screw is used to apply the first paste and the second paste in the controlled amount, wherein a number of screw rotations is 5 to 15 rpm and wherein the copper nanoparticles have an average size greater than 20 nm and less than 500 nm.

2. The method for manufacturing the thermoelectric conversion module according to claim 1,
    wherein the first paste and the second paste contain a dispersant and a thickener to maintain dispersion in a sedimentation test,
    a ratio of the thickener to a volume of only a solvent excluding the copper nanoparticles is 30 vol % or more and 90 vol % or less.

3. The method for manufacturing the thermoelectric conversion module according to claim 1,
    wherein the first paste and the second paste are spread over a range excluding at least a part of a corner part of a joint surface of the thermoelectric conversion element.

* * * * *